(12) United States Patent
Lu et al.

(10) Patent No.: US 11,397,453 B2
(45) Date of Patent: Jul. 26, 2022

(54) HEAT DISSIPATION SYSTEM

(71) Applicants: Inventec (Pudong) Technology Corporation, Shanghai (CN); INVENTEC CORPORATION, Taipei (TW)

(72) Inventors: Jyun-Ji Lu, Taipei (TW); Sheng-Chieh Hsu, Taipei (TW); Chih-Kai Yang, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 204 days.

(21) Appl. No.: 16/896,204

(22) Filed: Jun. 8, 2020

(65) Prior Publication Data
US 2021/0149463 A1    May 20, 2021

(30) Foreign Application Priority Data
Nov. 15, 2019    (CN) .......................... 201911118445.9

(51) Int. Cl.
*G06F 1/20* (2006.01)
*F28D 15/04* (2006.01)
*H05K 7/20* (2006.01)

(52) U.S. Cl.
CPC .............. *G06F 1/203* (2013.01); *F28D 15/04* (2013.01); *H05K 7/20154* (2013.01); *H05K 7/20172* (2013.01); *H05K 7/20336* (2013.01); *G06F 2200/201* (2013.01)

(58) Field of Classification Search
CPC ....... G06F 1/20; G06F 1/203; H05K 7/20172; F28D 15/02; F28D 15/0275
See application file for complete search history.

(56) References Cited

U.S. PATENT DOCUMENTS

| | | | |
|---|---|---|---|
| 2007/0086157 A1* | 4/2007 | Ruch | G06F 1/203 361/679.55 |
| 2016/0077558 A1* | 3/2016 | Delano | F28F 13/06 165/122 |

FOREIGN PATENT DOCUMENTS

| | | | |
|---|---|---|---|
| CN | 110494013 A | * | 11/2019 |
| CN | 110494013 A | | 11/2019 |
| KR | 20070063618 A | * | 6/2007 |
| TW | 201518917 A | | 5/2015 |

* cited by examiner

*Primary Examiner* — Eric S Ruppert
(74) *Attorney, Agent, or Firm* — CKC & Partners Co., LLC

(57) ABSTRACT

A heat dissipation system includes a single fan, first and second heat sources, first, second, and third heat pipes, and first and second heat dissipation arrays. The first heat pipe is thermally coupled with the first heat source. The second heat pipe is thermally coupled with the second heat source. The third heat pipe has a first position thermally coupled with the first heat pipe and a second position thermally coupled with the second heat pipe. The first heat dissipation array is arranged around the first position and thermally coupled with the third heat pipe. The second heat dissipation array is arranged around the second position and thermally coupled with the third heat pipe. The single fan is between the first and second heat sources, and configured to blow airflows towards the first and second heat sources, the first and second heat dissipation arrays.

9 Claims, 3 Drawing Sheets

HEAT DISSIPATION SYSTEM

CROSS-REFERENCE TO RELATED APPLICATION

This application claims priority to China Application Serial Number 201911118445.9, filed Nov. 15, 2019 which is herein incorporated by reference in its entirety.

BACKGROUND

Field of Invention

The present disclosure relates to a heat dissipation system, and more particularly, to a heat dissipation system including single one fan.

Description of Related Art

In a heat dissipation system of a high-performance notebook computer system, a dual-fan cooling system is often required to meet the heat dissipation requirements. However, the dual-fan cooling system is often accompanied with noises and vibrations in its operation, and the power consumption for two fans is also high.

Therefore, there is a need to provide an improved heat dissipation system to solve the problems occurred in the conventional heat dissipation technologies.

SUMMARY

In one or more embodiments, a heat dissipation system includes a single fan, first and second heat sources, first, second, and third heat pipes, and first and second heat dissipation arrays. The first heat pipe is thermally coupled with the first heat source. The second heat pipe is thermally coupled with the second heat source. The third heat pipe has a first position thermally coupled with the first heat pipe and a second position thermally coupled with the second heat pipe. The first heat dissipation array is arranged around the first position and thermally coupled with the third heat pipe. The second heat dissipation array is arranged around the second position and thermally coupled with the third heat pipe. The single fan is located between the first heat source and the second heat source, and configured to blow airflows towards all of the first heat source, the second heat source, the first heat dissipation array and the second heat dissipation array.

In one or more embodiments, all the side through holes have lengthwise directions in parallel with one another.

In one or more embodiments, the heat dissipation system further includes a battery location section spaced from the first heat source and the second heat source, the single fan is further configured to blow airflows towards the battery location section and an area between the battery location section and the first and second heat sources.

In one or more embodiments, the first heat source is one of a central processing unit and a graphical processing unit.

In one or more embodiments, the second heat source is the other one of the central processing unit and the graphical processing unit.

In one or more embodiments, the central through hole is a circular hole.

In one or more embodiments, the third heat pipe is arranged perpendicularly to the first heat pipe and the second heat pipe.

In one or more embodiments, the first heat dissipation array includes a plurality of first heat dissipation fins each arranged perpendicularly to the third heat pipe.

In one or more embodiments, the second heat dissipation array includes a plurality of second heat dissipation fins each arranged perpendicularly to the third heat pipe.

In one or more embodiments, the single fan includes an impeller, a motor and a plurality of support posts, air outlets are defined between the support posts, the motor is configured to rotate the impeller to generate airflows through the air outlets.

In one or more embodiments, the heat dissipation system further includes an upper housing wall and a lower housing wall, the single fan, the first, second and third heat pipes, the first and second heat sources and the first and second heat dissipation arrays are located between the upper housing wall and the lower housing wall.

In one or more embodiments, at least one of the upper housing wall and the lower housing wall includes an air inlet.

In sum, the heat dissipation system disclosed herein utilizes a single fan to generate airflows towards heat sources, heat pipes, and heat dissipation arrays in the surroundings, such that the airflows output by the single fan can be optimally used, thereby avoiding the disadvantages of using plural fans. The support posts of the fan is used to replace the design of the sidewalls, so that air outlets are formed between adjacent support posts, and the support posts also form a support structure inside the casing of the electronic device.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
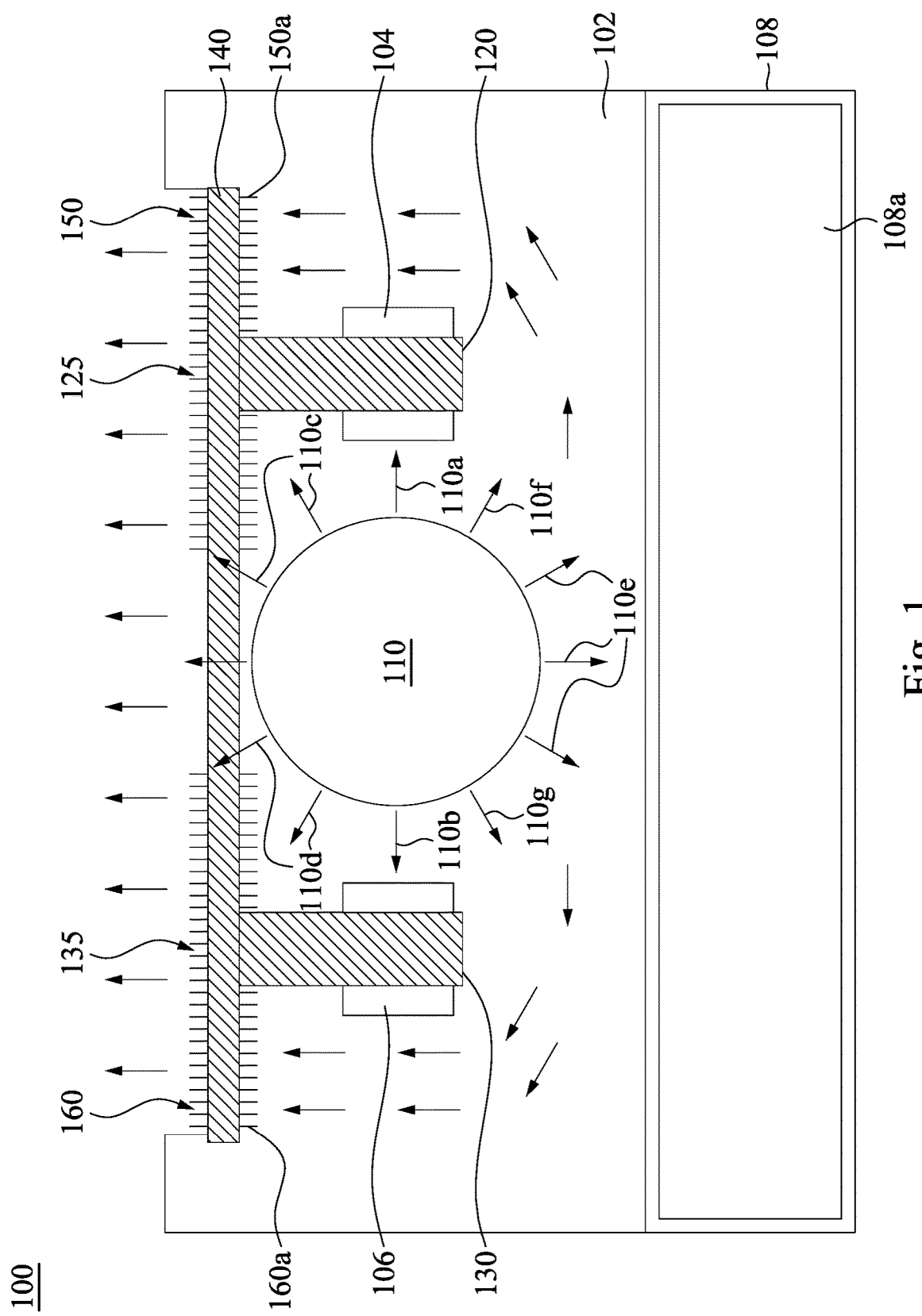
FIG. 1 illustrates a schematic planar view of a heat dissipation system according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

Reference is made to FIG. 1, which illustrates a schematic planar view of a heat dissipation system 100 according to one embodiment of the present disclosure. The heat dissipation system 100 includes a first heat source 104 and a second heat source 106 located on the circuit board 102. The first heat source 104 may be one of a central processing unit and a graphical processing unit, and the second heat source 106 may be the other one of the central processing unit and the graphical processing unit. When the first and second heat sources (104, 106) are processors with large power consumption, it is common to design an independent heat dissipation system for individual processors. In an embodiment of the present invention, a first heat pipe 120 is thermally coupled to the first heat source 104, a second heat pipe 130 is thermally coupled to the second heat source 106, and a third heat pipe 140 is further thermally coupled to the first and second heat pipes (120, 130), such that the heat generated by the first and second heat sources (104, 106) is transferred to the third heat pipe 140 via the first and second heat pipes (120, 130) respectively.

In an embodiment of the present invention, the third heat pipe 140 is arranged perpendicularly to the first and second heat pipes (120, 130), but not being limited thereto.

In an embodiment of the present invention, the third heat pipe 140 has a first position 125 thermally coupled with the first heat pipe 120 and a second position 135 thermally coupled with the second heat pipe 130. The first heat dissipation array 150 is located around the first position 125 and thermally coupled with the third heat pipe 140, and the second heat dissipation array 160 is located around the second position 135 and thermally coupled with the third heat pipe 140.

In an embodiment of the present invention, the first heat dissipation array 150 includes a plurality of first heat dissipation fins 150a, and each first heat dissipation fin 150a is arranged perpendicularly to the third heat pipe 140, but not limited thereto. The second heat dissipation array 160 includes a plurality of second heat dissipation fins 160a, and each second heat dissipation fin 160a is arranged perpendicularly to the third heat pipe 140, but not limited thereto.

In an embodiment of the present invention, the single fan 110 is positioned between the first and second heat sources (104, 106) to generate a plurality of airflows toward the first heat source 104, the second heat source 106, the first heat dissipation array 150, and the second heat dissipation array 160. For example, the fan 110 may generate an airflow 110a towards the first heat source 104, an airflow 110b towards the second heat source 106, an airflow 110c towards the first heat dissipation array 150, and an airflow 110c towards the second heat dissipation array 160.

In an embodiment of the present invention, the heat dissipation system 100 also includes a battery location section 108 to install a battery 108a thereon or within. The battery 108a is separated from the first and second heat sources (104, 106) to form an airflow channel therebetween. The single fan 110 is surrounded by the first, second, and third heat pipes (120, 130, 140) and the battery location section 108. The single fan 110 is further used to generate a plurality of airflows toward the battery location section 108 and an area between the battery location section 108 and the first and second heat sources (104, 106). For example, the airflow 110e generated by the fan 110 is directed towards the battery location section 108, the airflow 110f is directed towards the area between the battery location section 108 and the first heat source 104, and the airflow 110g is directed towards the area between the battery location section 108 and the second heat source 106. The airflow 110f will then be directed towards the first heat dissipation array 150 in an arrow direction in FIG. 1, and the airflow 110g will then be directed towards the second heat dissipation array 160 in an arrow direction in FIG. 1, such that all airflows in various directions generated by the fan 110 can be fully used for the heat dissipation purpose.

Figure 2:
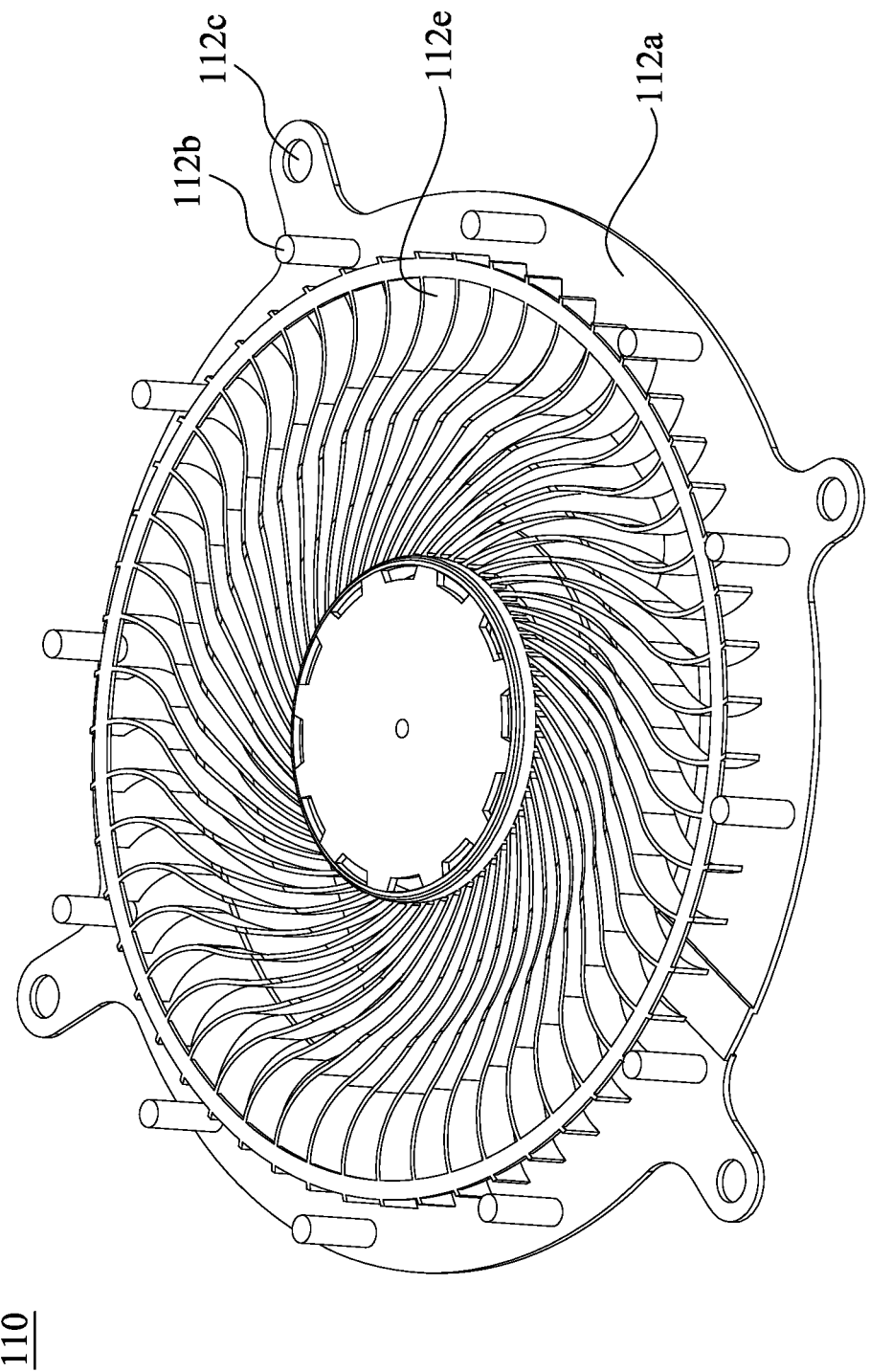
FIG. 2 illustrates a perspective view of a heat dissipation fan according to one embodiment of the present disclosure.
Figure 3:
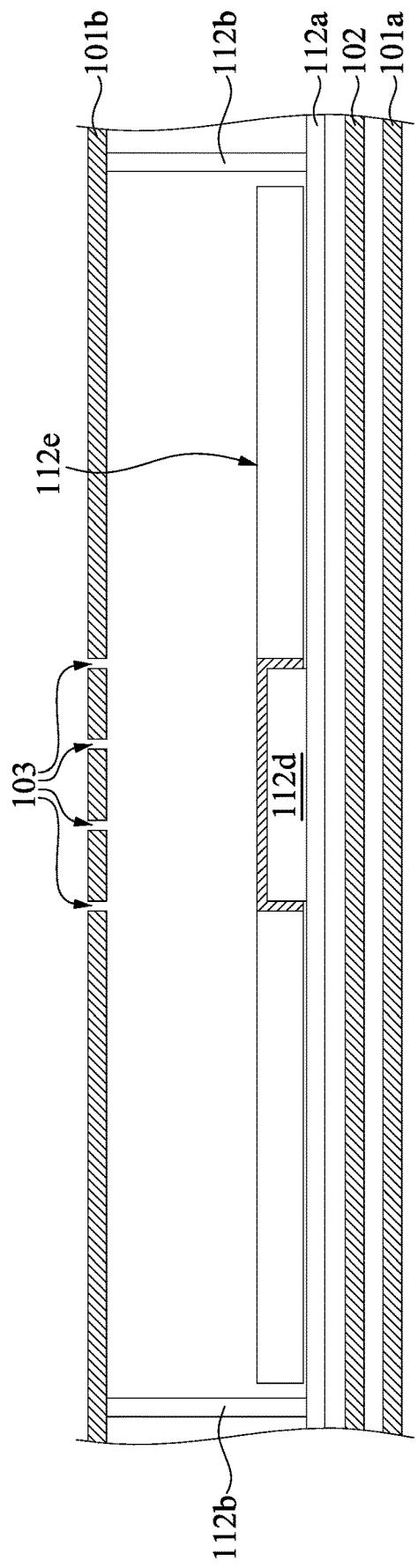
FIG. 3 illustrates a cross-sectional view of a heat dissipation system according to one embodiment of the present disclosure.

Reference is made to both FIGS. 2 and 3, FIG. 2 illustrates a perspective view of a heat dissipation fan according to one embodiment of the present disclosure, and FIG. 3 illustrates a cross-sectional view of a heat dissipation system according to one embodiment of the present disclosure. The fan 110 includes a bottom board 112a, an impeller 112e, a motor 112d, and multiple support posts 112b. The bottom board 112a can be secured to a casing of an electronic device through its screw hole 112c. The support posts 112b may protrude from the bottom board 112a in one piece, or installed on the bottom board 112a by bonding, welding, or riveting, etc. Between adjacent support posts 112b, air outlets may be formed for outputting the airflows (e.g., 110a-110g). The motor 112d is used to rotate the impeller 112e to generate the airflows (e.g., 110a-110g) through the air outlets.

In an embodiment of the present invention, the heat dissipation system 100 is located between an upper housing wall 101b and a lower housing wall 101a of an electronic device. The tops of the support posts 112b of the fan 110 are used to abut the upper housing wall 101b to form a support structure inside the electronic device casing. A cross section of the support post 112b may be circular or other shapes that are less likely to cause airflow resistance, but not limited thereto. For example, the cross section of the support post 112b can be square, rectangular, oval, trapezoidal, triangular, or polygonal, etc.

The support posts of the fan 110 are designed to combine the support structure and the bottom board on the fan unit. By the adjustment of various parameters, it can be modularized and applied to various systems, thereby greatly simplifying the development process. In addition, the flow field and stress analysis can be carried out according to the strength requirements of the system. Each support position can be configured to reduce noise and increase the strength of the mechanism around the fan.

In an embodiment of the present invention, when the fan 110 is in operation, airflows are introduced through the air inlets 103 of the upper housing wall 101b, and then blown out to the components around the fan 110 through the air outlets. The air inlets 103 can also be designed on the lower housing wall 101a as required, not limited to the upper housing wall 101b.

In summary, the heat dissipation system disclosed herein utilizes a single fan to generate airflows towards heat sources, heat pipes, and heat dissipation arrays in the surroundings, such that the airflows output by the single fan can be optimally used, thereby avoiding the disadvantages of using plural fans. The support posts of the fan is used to replace the design of the sidewalls, so that air outlets are formed between adjacent support posts, and the support posts also form a support structure inside the casing of the electronic device.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A heat dissipation system comprising:
   a first heat source;
   a first heat pipe thermally coupled with the first heat source;
   a second heat source;

a second heat pipe thermally coupled with the second heat source;

a third heat pipe having a first position thermally coupled with the first heat pipe and a second position thermally coupled with the second heat pipe;

a first heat dissipation array disposed around the first position and thermally coupled with the third heat pipe;

a second heat dissipation array disposed around the second position and thermally coupled with the third heat pipe; and a single fan disposed between the first heat source and the second heat source, and configured to blow airflows towards all of the first heat source, the second heat source, the first heat dissipation array and the second heat dissipation array, wherein the single fan comprises a bottom board, an impeller, a motor and a plurality of support posts protruding from the bottom board, air outlets are defined between the support posts, the motor is configured to rotate the impeller to generate airflows through the air outlets, a plurality of screw holes are presented on the bottom board and not presented on the support posts, the screw holes are radially farther from the motor than the support posts.

2. The heat dissipation system of claim 1 further comprising a battery location section spaced from the first heat source and the second heat source, the single fan is further configured to blow airflows towards the battery location section and an area between the battery location section and the first and second heat sources.

3. The heat dissipation system of claim 1, wherein the first heat source is one of a central processing unit and a graphical processing unit.

4. The heat dissipation system of claim 3, wherein the second heat source is the other one of a central processing unit and a graphical processing unit.

5. The heat dissipation system of claim 1, wherein the third heat pipe is arranged perpendicularly to the first heat pipe and the second heat pipe.

6. The heat dissipation system of claim 1, wherein the first heat dissipation array includes a plurality of first heat dissipation fins each arranged perpendicularly to the third heat pipe.

7. The heat dissipation system of claim 1, wherein the second heat dissipation array includes a plurality of second heat dissipation fins each arranged perpendicularly to the third heat pipe.

8. The heat dissipation system of claim 1 further comprising an upper housing wall and a lower housing wall, the single fan, the first, second and third heat pipes, the first and second heat sources, and the first and second heat dissipation arrays are located between the upper housing wall and the lower housing wall.

9. The heat dissipation system of claim 8, wherein at least one of the upper housing wall and the lower housing wall includes an air inlet.

* * * * *